(12) United States Patent
Lin et al.

(10) Patent No.: US 7,833,810 B2
(45) Date of Patent: Nov. 16, 2010

(54) METHOD OF FABRICATING ISOLATION STRUCTURES FOR CMOS IMAGE SENSOR CHIP SCALE PACKAGES

(75) Inventors: Tzu-Han Lin, Hshinchu (TW); Tzy-Ying Lin, Hsinchu (TW); Fang-Chang Liu, Hsinchu (TW); Kai-Chih Wang, Taoyuan (TW)

(73) Assignee: VisEra Technologies Company Limited, Hsinchu (TW)

( * ) Notice: Subject to any disclaimer, the term of this patent is extended or adjusted under 35 U.S.C. 154(b) by 0 days.

(21) Appl. No.: 12/493,758

(22) Filed: Jun. 29, 2009

(65) Prior Publication Data
US 2009/0263927 A1    Oct. 22, 2009

Related U.S. Application Data

(62) Division of application No. 11/649,242, filed on Jan. 4, 2007, now Pat. No. 7,569,409.

(51) Int. Cl.
*H01L 21/00* (2006.01)
*H01L 23/544* (2006.01)

(52) U.S. Cl. .................. 438/26; 438/33; 438/113; 438/458; 438/462; 257/620; 257/622; 257/623; 257/E21.632

(58) Field of Classification Search .................. None
See application file for complete search history.

(56) References Cited

U.S. PATENT DOCUMENTS

| | | | |
|---|---|---|---|
| 6,777,767 B2 | 8/2004 | Badehi | |
| 6,917,090 B2 | 7/2005 | Moden | |
| 7,067,354 B2 | 6/2006 | Prabhu | |
| 7,372,122 B2 | 5/2008 | Kang | |
| 7,374,971 B2 | 5/2008 | Yuan et al. | |
| 7,569,409 B2 * | 8/2009 | Lin et al. | 438/33 |
| 2001/0018236 A1 | 8/2001 | Badehi | |
| 2003/0230805 A1 | 12/2003 | Noma et al. | |
| 2006/0079019 A1 | 4/2006 | Kim | |
| 2006/0237850 A1 | 10/2006 | Yuan et al. | |
| 2007/0026639 A1 | 2/2007 | Noma et al. | |
| 2007/0267647 A1* | 11/2007 | Lee et al. | 257/99 |
| 2008/0164550 A1* | 7/2008 | Chen et al. | 257/432 |

FOREIGN PATENT DOCUMENTS

CN   1409869 A   4/2003

* cited by examiner

*Primary Examiner*—Alonzo Chambliss
(74) *Attorney, Agent, or Firm*—Muncy, Geissler, Olds & Lowe, PLLC

(57) ABSTRACT

Isolation structure for CMOS image sensor device chip scale packages and fabrication methods thereof. A CMOS image sensor chip scale package includes a transparent substrate configured as a support structure for the package. The transparent substrate includes a first cutting edge and a second cutting edge. A CMOS image sensor die with a die circuitry is mounted on the transparent substrate. An encapsulant is disposed on the substrate encapsulating the CMOS image sensor die. A connection extends from the die circuitry to a plurality of terminal contacts for the package on the encapsulant, wherein the connection is exposed by the first cutting edge. An isolation structure is disposed on the first cutting edge passivating the exposed connection and co-planed with the second cutting edge.

8 Claims, 6 Drawing Sheets

METHOD OF FABRICATING ISOLATION STRUCTURES FOR CMOS IMAGE SENSOR CHIP SCALE PACKAGES

BACKGROUND OF THE INVENTION

1. Field of the Invention

The invention relates to electronic device chip scale packages, and more particularly to isolation structures for CMOS image sensor chip scale packages (CIS-CSPs) and fabrication methods thereof.

2. Description of the Related Art

CMOS image sensor devices are used in a wide variety of applications, such as digital still cameras (DSC). These devices utilize an array of active pixels or image sensor cells, comprising photodiode elements, to receive electromagnetic radiation to convert images to streams of digital data.

Chip scale packages (CSPs) are designed for flip chip bonding to a supporting substrate, such as a package substrate, a module substrate or a printed circuit board (PCB). With flip chip bonding, bumps, pins or other terminal contacts on the package, are bonded to mating contacts on the supporting substrate. The bonded terminal contacts provide the physical and electrical connections between the package and the supporting substrate.

U.S. Pat. No. 6,917,090, the entirety of which is hereby incorporated by reference, discloses a chip scale image sensor semiconductor package, a method for fabricating the package, and systems incorporating the package. Forming bonded connections between the substrate bonding contact and the die bonding contacts by wire bonds or tape leads is however, tedious.

To solve the bonded connection problem, a shellcase semiconductor device chip scale package technique has been developed. U.S. Pub. No. 2001/0018236, the entirety of which is hereby incorporated by reference, discloses a semiconductor chip scale package technique. T-shaped connections between the substrate bonding contact and the die bonding contacts are provided. The T-shaped connections are protected by a passivation layer. After a wafer assembly is singulated by dicing it into a plurality of separate integrated circuit device packages, the T-shaped connection end, however, is exposed, resulting in weak spots vulnerable to corrosion and peeling. Thus, the integrated circuit device packages fail to pass reliability tests such as the high temperature/high humidity test.

FIGS. 1A-1B are cross sections illustrating conventional fabrication steps of dicing a chip scale package wafer assembly. Referring to FIG. 1A, a transparent substrate 10 configured as a support structure for a chip scale package comprises a CMOS image sensor die 20 with a die circuitry attached thereon. The CMOS image sensor die 20 comprises a sensor area with a micro-lens array 22 configured as an image plane. A passivation layer 24 is disposed on the micro-lens array 22. A spacer 15, defines cavity 18, between the substrate 10 and the CMOS image sensor die 20. An encapsulant 30 is formed on the substrate encapsulating the CMOS image sensor die 20. An optional structure 35, such as glass, is disposed on the encapsulant 30 to strengthen the package. A T-shaped connection 40 extending from the die circuitry to a plurality of terminal contacts 70 for the package. The T-shaped connection 140 connects the substrate bonding contact (not shown) to the die bonding contacts 25. A buffer layer 50 is disposed on the T-shaped connection 40. The T-shaped connection 40 is protected by a passivation layer 60.

Referring to FIG. 1B, the resulting wafer scale assembly 1 is diced to yield a plurality of packaged integrated circuit devices 1A and 1B. One end of T-shaped connection is exposed resulting in weak spots vulnerable to corrosion and peeling. The exposed T-shaped connections encounter problems of corrosion and peeling due to moisture penetration. Thus, the integrated circuit device packages fail to pass reliability tests such as the high temperature/high humidity test.

An isolation capable of preventing exposed connections from moisture penetration damage, has long been sought.

BRIEF SUMMARY OF THE INVENTION

The invention is directed to isolation structure for semiconductor device chip scale packages to prevent exposed connections from damage against corrosion and peeling due to moisture penetration.

The invention provides an electronic device chip scale package, comprising a substrate configured as a support structure for the chip scale package comprising a first cutting edge and a second cutting edge; a semiconductor die with a die circuitry attached on the substrate; an encapsulant on the substrate encapsulating the semiconductor die; a connection extending from the die circuitry to a plurality of terminal contacts for the chip scale package on the encapsulant, the connection being exposed by the first cutting edge; and an isolation structure disposed on the first cutting edge passivating the exposed connection and co-planed with the second cutting edge.

The invention further provides a CMOS image sensor chip scale package, comprising: a transparent substrate configured as a support structure for the package, the transparent substrate comprising a first cutting edge and a second cutting edge; a CMOS image sensor die with a die circuitry attached on the transparent substrate; an encapsulant on the substrate encapsulating the CMOS image sensor die; a connection extending from the die circuitry to a plurality of terminal contacts for the package on the encapsulant, the connection exposed by the first cutting edge; and an isolation on the first cutting edge passivating the exposed connection and co-planed with the second cutting edge.

The invention further provides a method for fabricating a CMOS image sensor chip scale package. A transparent substrate with two adjacent CMOS image sensor dies mounted thereon is provided. An encapsulant encapsulates each CMOS image sensor die, wherein a connection extends between both the CMOS image sensor dies and connects to a plurality of terminal contacts for the package on the encapsulant corresponding to each package. The transparent substrate is cut into a predetermined depth creating a trench to separate and to expose a portion of the connection corresponding to each CMOS image sensor die. An isolation structure is employed to fill the trench passivating the exposed connection. The transparent substrate is cut to separate CMOS image sensor packages.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
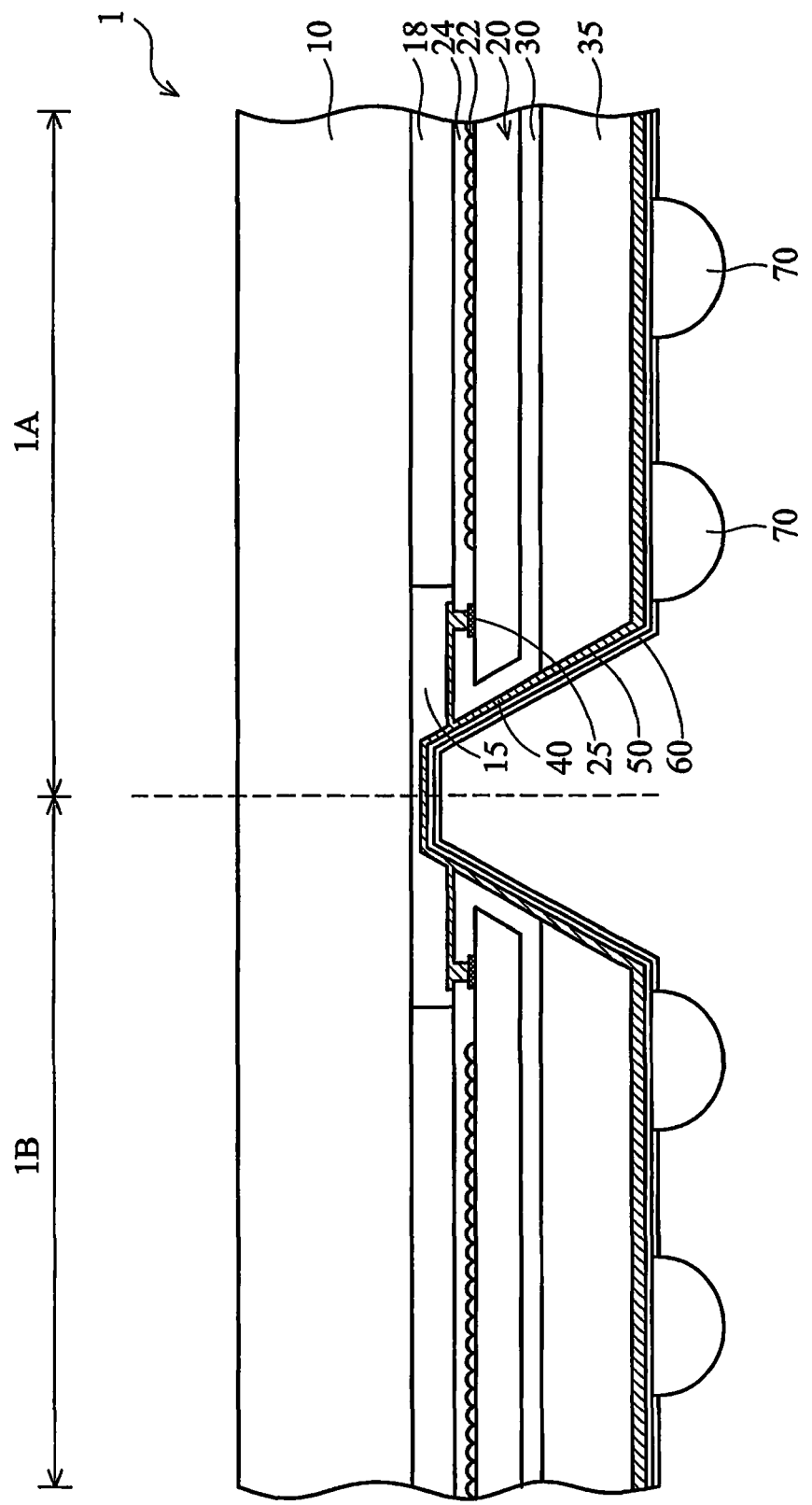
FIGS. 1A-1B are cross sections illustrating conventional fabrication steps of dicing a chip scale package wafer assembly.
Figure 1B:
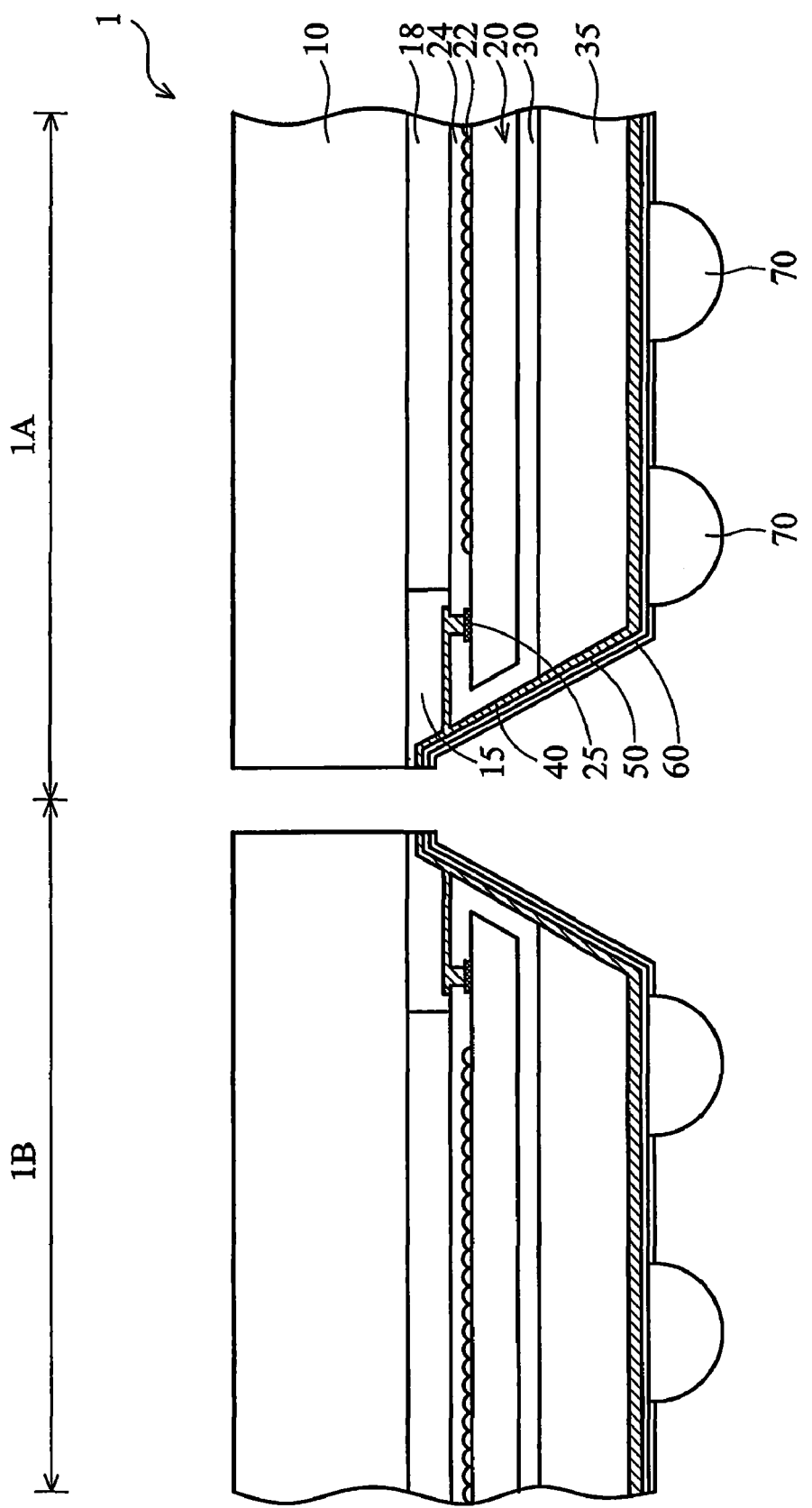
Figure 2A:
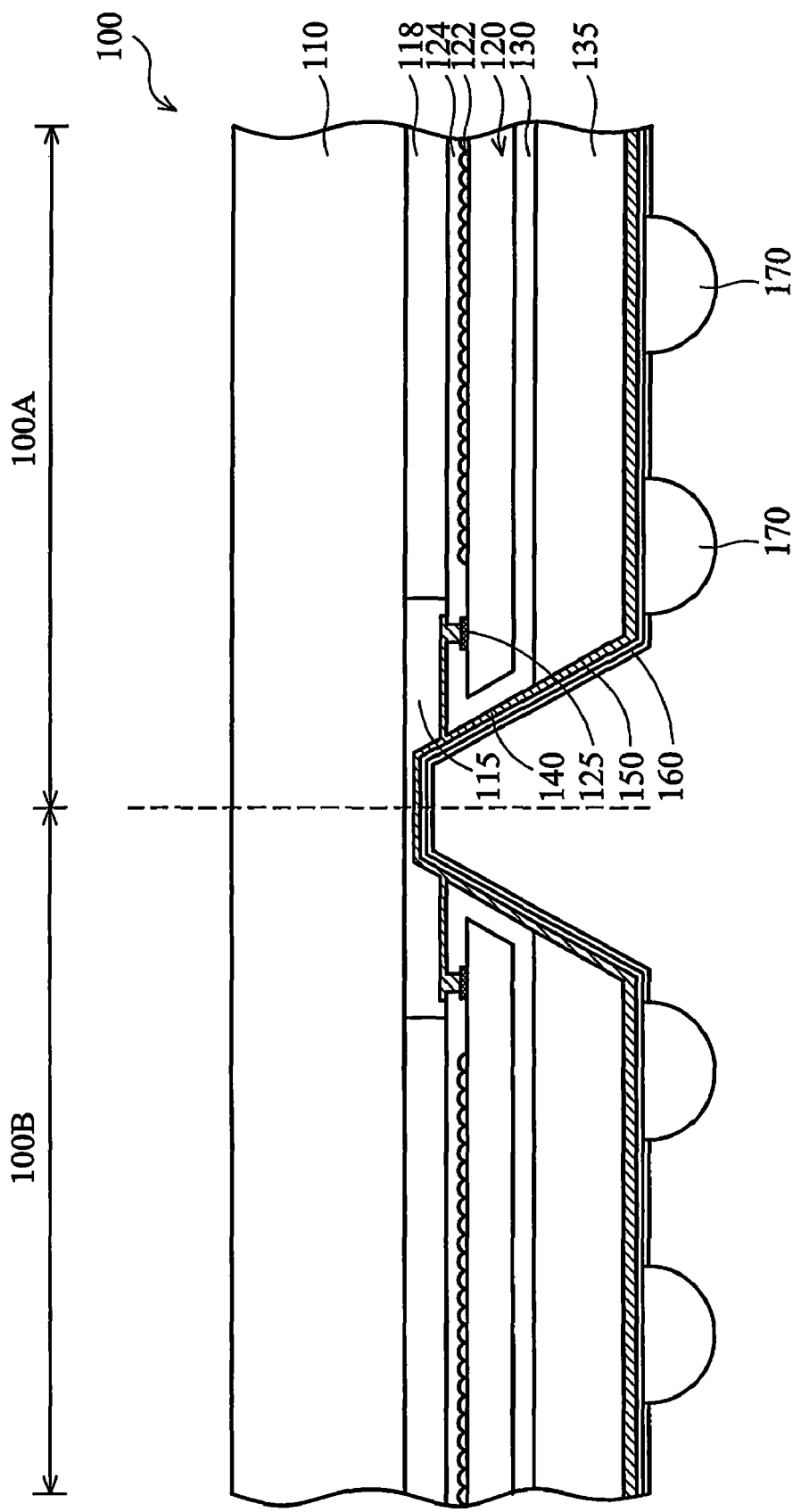
FIGS. 2A-2D are cross sections illustrating an exemplary embodiment of steps for fabricating a CMOS image sensor chip scale package of the invention.

FIGS. 2A-2D are cross sections illustrating an exemplary embodiment of steps for fabricating a CMOS image sensor chip scale package of the invention. Referring to FIG. 2A, a wafer scale assembly 100 comprises two adjacent chip scale packages 100A and 100B. A transparent substrate 110 configured as a support structure for the wafer scale assembly 100 is provided. The transparent substrate 110 preferably comprises lens quality glass or quartz. A semiconductor die with a die circuitry attached thereon is mounted on the transparent substrate. For example, a CMOS image sensor device die 120 is flip chip bonded on the transparent substrate 110. The CMOS image sensor device die 120 comprises a sensor area with a micro-lens array 122 configured as an image plane. A passivation layer 124 is disposed on the micro-lens array 122. A cavity 118 between the substrate 110 and the CMOS image sensor device die 120 is defined by spacers 115 such as a cavity wall or a dam structure. An encapsulant 130, such as epoxy is formed on the substrate encapsulating the CMOS image sensor die 120. An optional structure 135, such as glass is disposed on the encapsulant 130 to strengthen the package. A T-shaped connection 140 extending from the die circuitry to a plurality of terminal contacts for the package on the encapsulant. The T-shaped connection 140 connects the substrate bonding contact (not shown) to the die bonding contacts 125. A buffer layer 150 is disposed on the T-shaped connection 140. The T-shaped connection 140 is passivated by a first passivation layer 160. The T-shaped connection 140 comprises a horizontal portion bonded to die contacts 125 and an inclined portion bonded to the terminal contacts for the chip scale package. There are additional steps not mentioned here, which are required to complete the wafer scale assembly 100, but which are not essential to an understanding of the invention.

While this exemplary embodiment has been described in conjunction with an example of a CMOS image sensor chip scale package, the features of the invention may also be applied to other electronic device chip scale packages comprising an integrated circuit device, an optoelectronic device, an electromechanical device, or a surface acoustic wave (SAW) device.

A ball grid array 170 is formed on the terminal contacts for the chip scale package. For example a solder masker layer (not shown) is formed on the chip scale package exposed the predetermined terminal contact area. An array of solder balls is formed on the exposed terminal contact area.

Figure 2B:
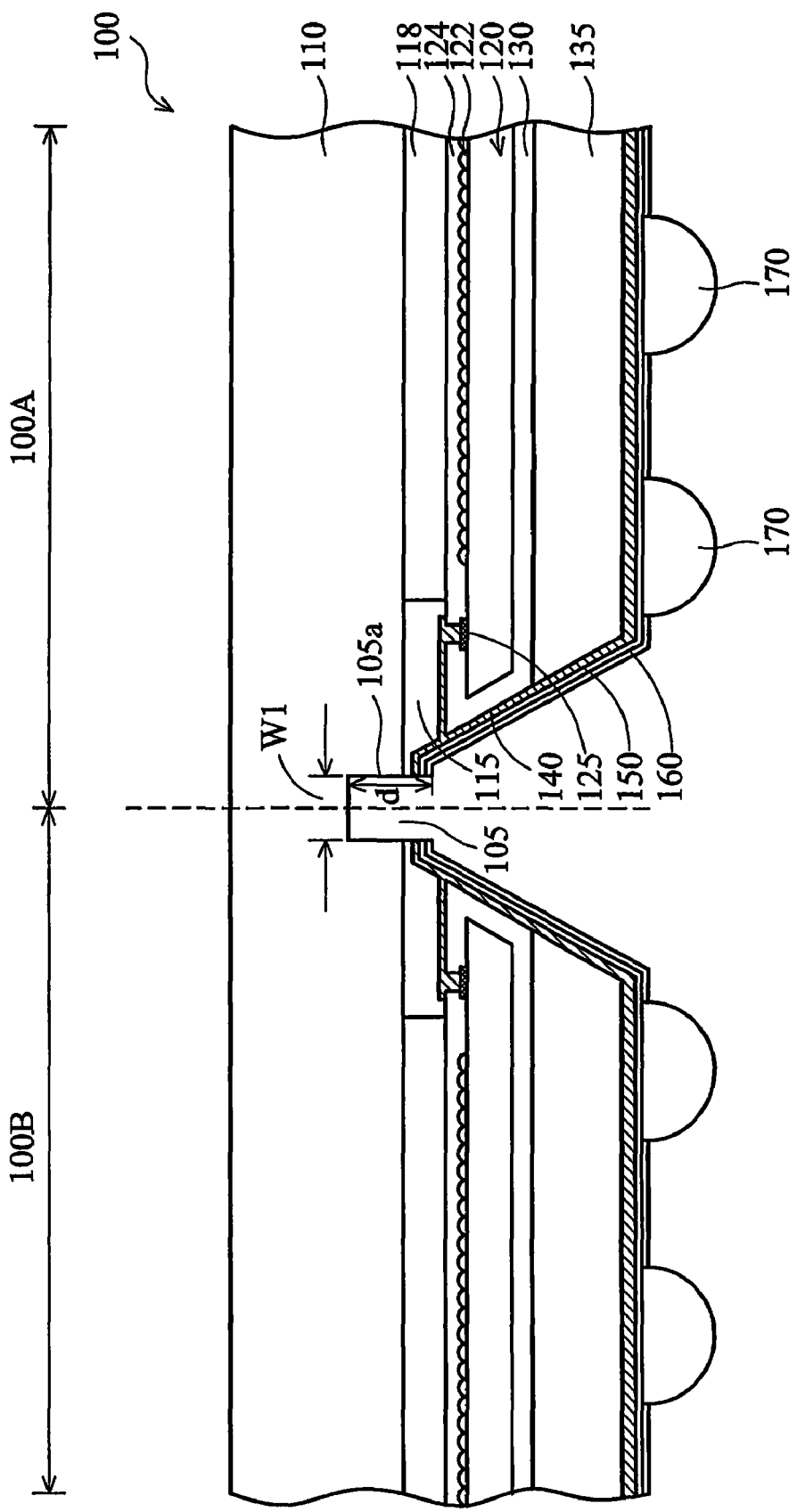

Referring to FIG. 2B, the wafer scale assembly 100 is cut along the cutting line into a predetermined depth d creating a trench 105 in the transparent substrate 110 to separate and yield a surface 105a exposing the connection 140 corresponding to each CMOS image sensor die 120. The wafer scale assembly 100 can be cut by a die saw with a first width. The depth d of the trench 105 is preferably in a range between about 20 μm and 50 μm. The width w1 of the trench 105 is preferably in a range between about 100 μm and 150 μm.

Figure 2C:
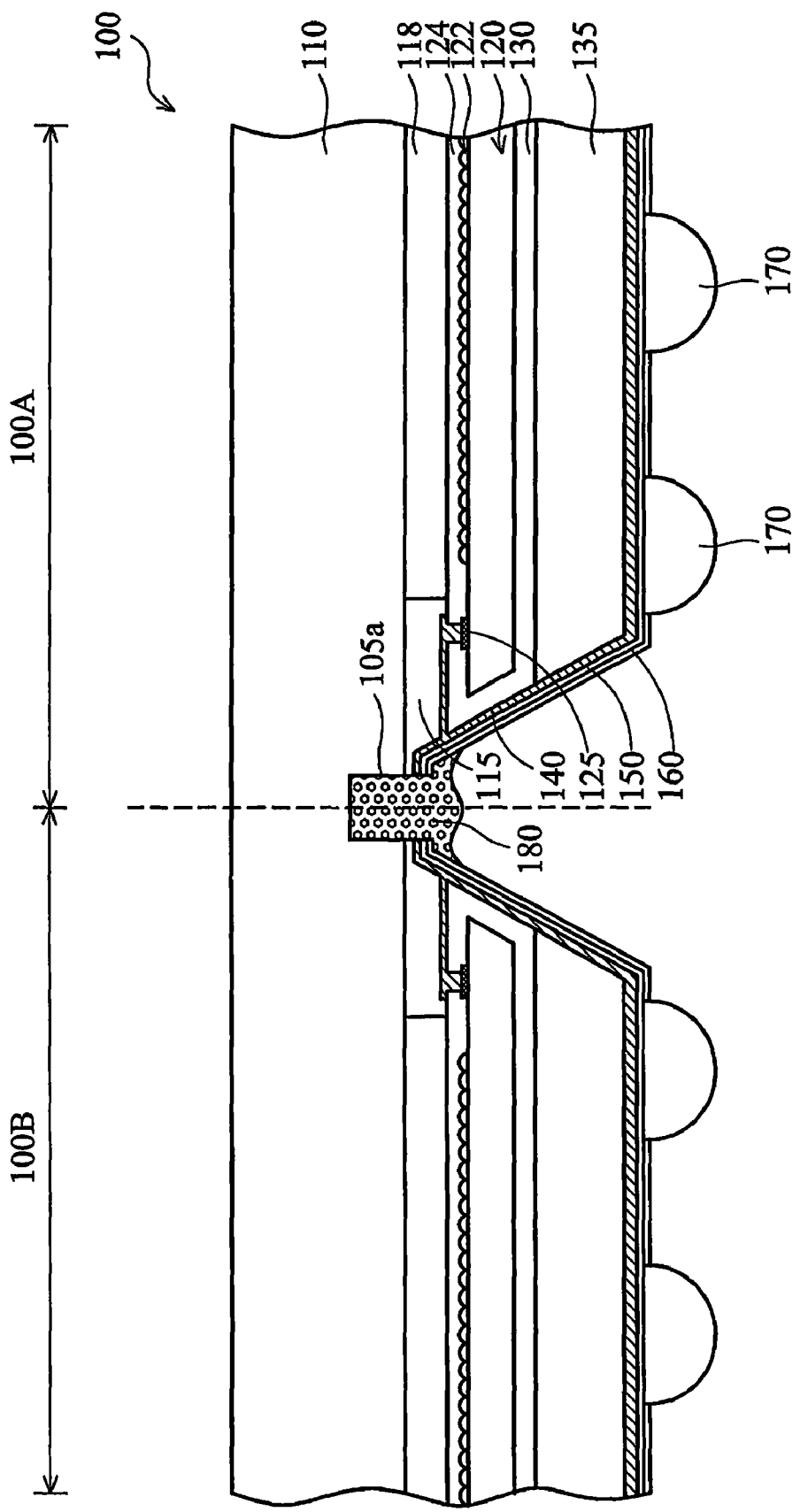

Referring to FIG. 2C, an isolation structure 180 is applied to fill the trench 105 passivating the exposed connection. The isolation structure 180 can be applied by chemical vapor deposition (CVD), physical vapor deposition (PVD), sputtering, printing, inkjet printing, dispensing, dipping, or spin coating. The isolation structure can be organic or inorganic materials, preferably comprising epoxy, polyimide, resin, silicon oxide, metal oxide, or silicon nitride.

Figure 2D:
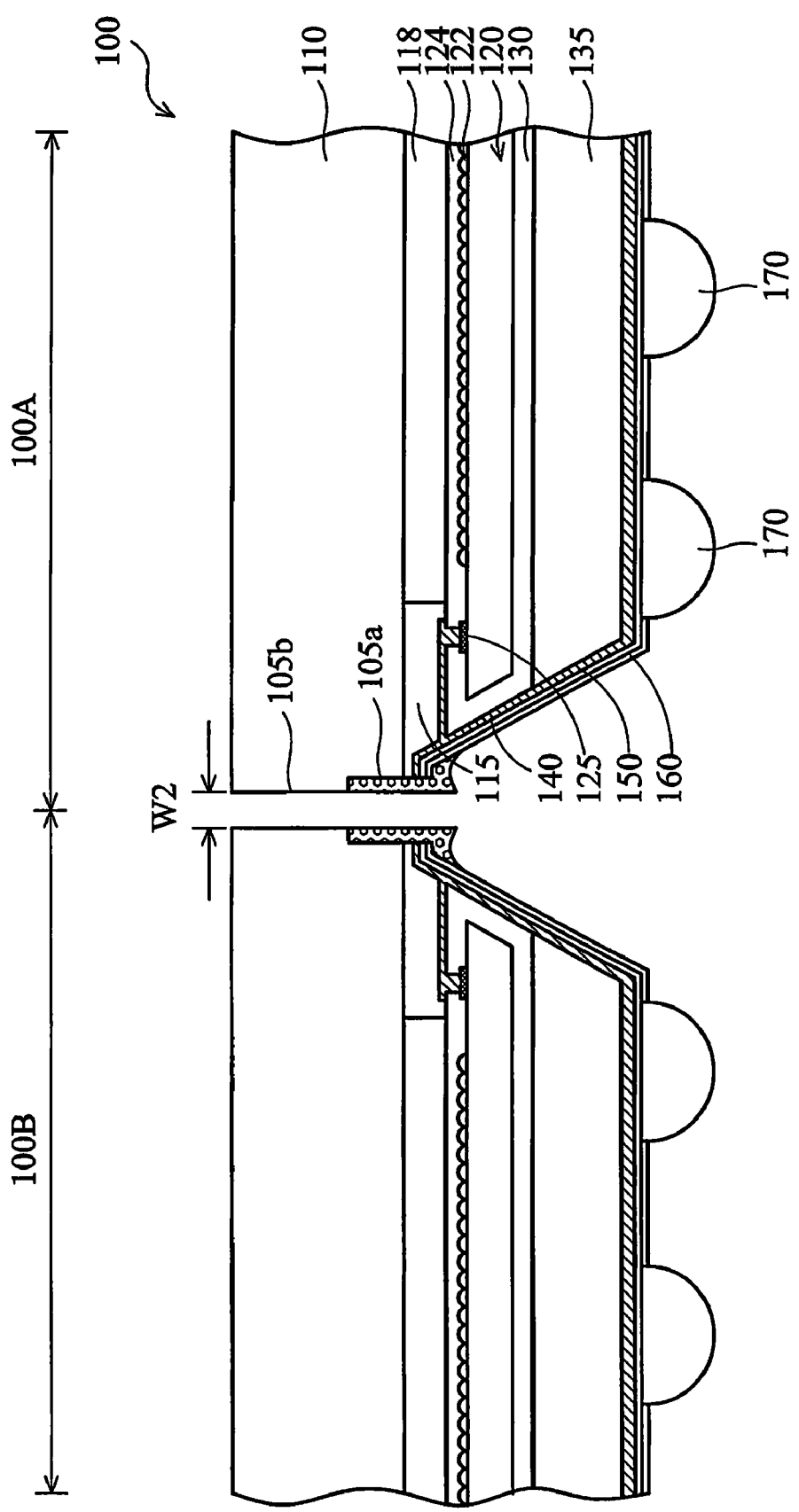

Referring to FIG. 2D, the wafer scale assembly 100 is subsequently cut along the cutting line to separate CMOS image sensor packages 100A and 100B. The wafer scale assembly 100 can be cut by a die saw with a second width. The width w2 of the die saw is preferably greater than 100 μm. Other steps not shown are undertaken to complete the CMOS image sensor chip scale package.

The CMOS image sensor chip scale package, thus formed by an embodiment of the invention, comprises a transparent substrate 110 configured as a support structure for the package. The transparent substrate comprises a first cutting edge 105a and a second cutting edge 105b. A CMOS image sensor die 120 with a die circuitry is attached to the transparent substrate. An encapsulant 130 is disposed on the substrate 110 encapsulating the CMOS image sensor die 120. A connection 140 extending from the die circuitry to a plurality of terminal contacts for the package on the encapsulant comprises a horizontal portion bonded to die contacts 125 and an inclined portion bonded to the terminal contacts for the chip scale package. The connection 140 is terminated and exposed by the first cutting edge 105a. An isolation 180 is disposed on the first cutting edge 105a passivating the exposed connection 140 and co-planar with the second cutting edge 105b.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a CMOS image sensor chip scale package, comprising:
   providing a transparent substrate with two adjacent CMOS image sensor dies mounted thereon and an encapsulant encapsulating each CMOS image sensor die, wherein a connection extends between both the CMOS image sensor dies and connect to a plurality of terminal contacts for the package on the encapsulant;
   cutting the transparent substrate into a predetermined depth creating a trench to separate and expose the connection corresponding to each CMOS image sensor die;
   filling an isolation structure into the trench passivating the exposed connection; and
   cutting the transparent substrate to separate CMOS image sensor packages.

2. The method according to claim 1, wherein the predetermined depth is approximately between 20 μm and 50 μm.

3. The method according to claim 1, wherein the step of cutting the transparent substrate into a predetermined depth is performed by a die saw with a first width.

4. The method according to claim 3, wherein the first width is approximately between 100 μm and 150 μm.

5. The method according to claim 1, wherein the step of applying an isolation structure is performed by sputtering, printing, dispensing, or spin coating.

6. The method according to claim 1, wherein the isolation structure comprises epoxy, polyimide, resin, silicon oxide, metal oxide, or silicon nitride.

7. The method according to claim 1, wherein the step of the transparent substrate to separate CMOS image sensor packages is performed by a die saw with a second width.

8. The method according to claim 7, wherein the second width is approximately greater than 150 μm.

* * * * *